United States Patent [19]
Oohara et al.

[11] Patent Number: 5,131,956
[45] Date of Patent: Jul. 21, 1992

[54] PHOTOVOLTAIC SEMICONDUCTOR DEVICE

[75] Inventors: Takahiko Oohara, Higashimurayama; Masaaki Usui, Itami; Nobuyoshi Ogasawara, Itami; Kotaro Mitsui, Itami, all of Japan

[73] Assignees: Mitsubishi Denki Kabushiki Kaisha; Nippon Telegraph and Telephone Corporation, both of Japan

[21] Appl. No.: 680,690

[22] Filed: Mar. 28, 1991

[30] Foreign Application Priority Data

Mar. 29, 1990 [JP] Japan .................................. 2-86130

[51] Int. Cl.⁵ ............................................ H01L 31/05
[52] U.S. Cl. .................................... 136/256; 136/244; 136/262
[58] Field of Search ........................ 136/244, 256, 262

[56] References Cited

U.S. PATENT DOCUMENTS 3,527,619 9/1970 Miley .................................. 136/244
5,017,243 5/1991 Otsubo .............................. 136/244

FOREIGN PATENT DOCUMENTS 64-61958 3/1989 Japan .................................. 136/262

Primary Examiner—Aaron Weisstuch
Attorney, Agent, or Firm—Leydig, Voit & Mayer

[57] ABSTRACT

A photovoltaic semiconductor device includes a first conductivity type silicon substrate having a first main surface, a first conductivity type compound semiconductor layer disposed on a first, major portion of the first main surface of the silicon substrate, a second conductivity type compound semiconductor layer disposed on the first conductivity type compound semiconductor layer, a first electrode connected to the second conductivity type compound semiconductor layer, a portion of the first electrode being disposed on a second, minor portion of the first main surface of the silicon substrate with an intervening insulating film, and a second electrode disposed on a third, minor portion of the first main surface of the silicon substrate.

19 Claims, 15 Drawing Sheets

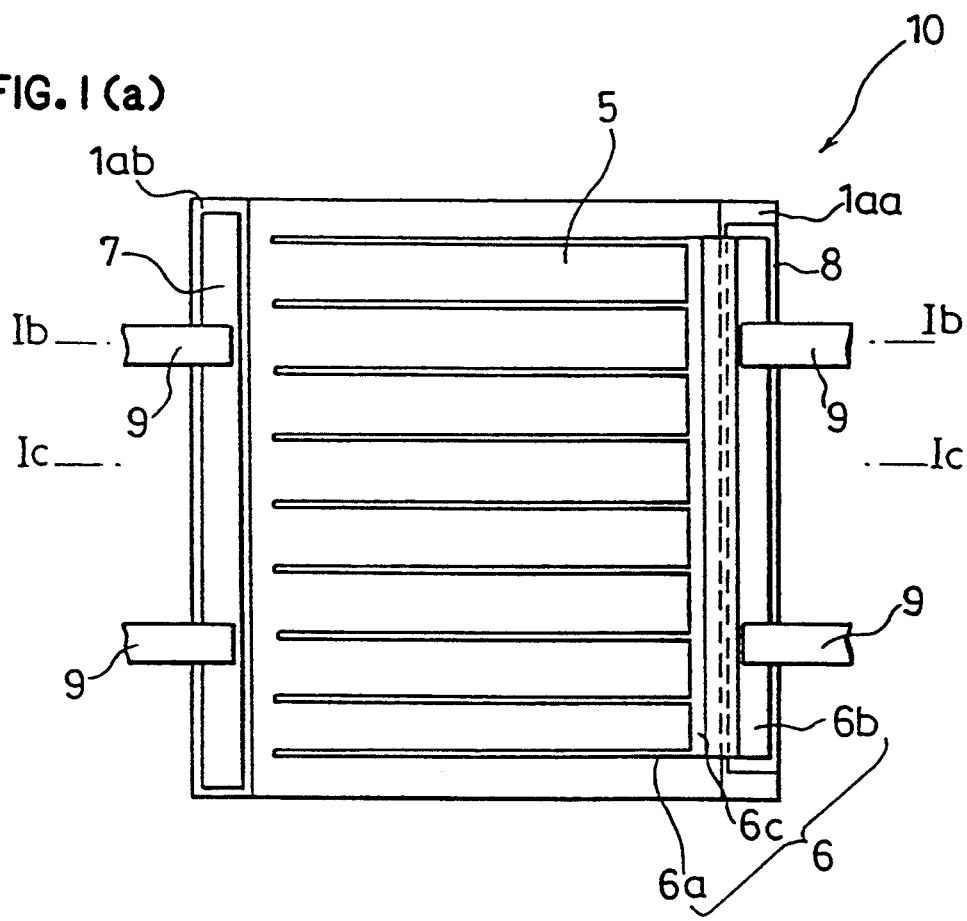
FIG. I(a)
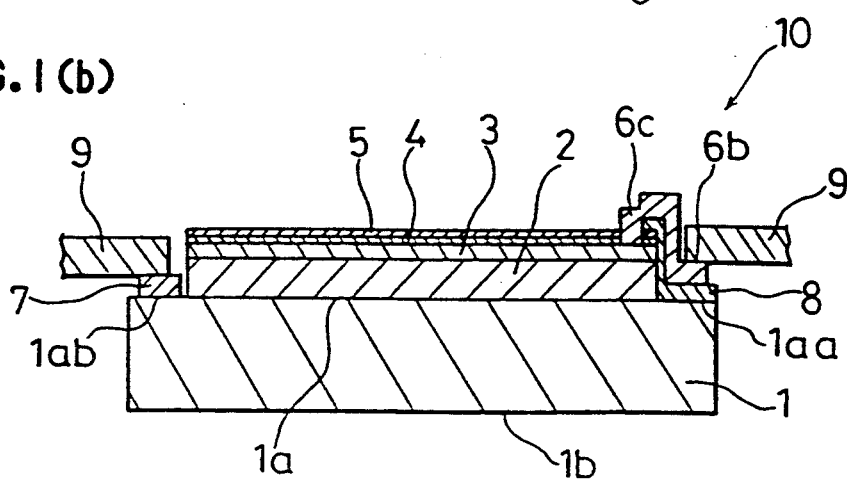
FIG. I(b)

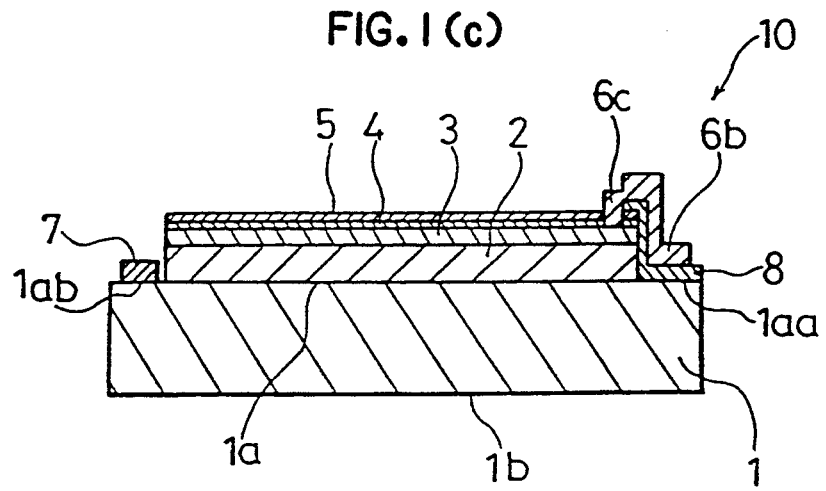

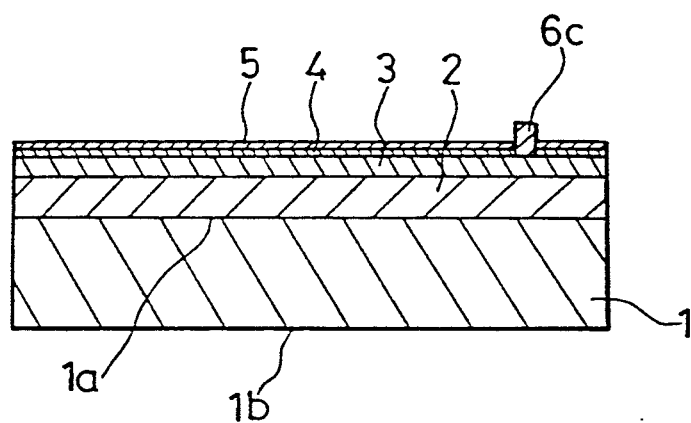

F I G. 6
F I G. 7
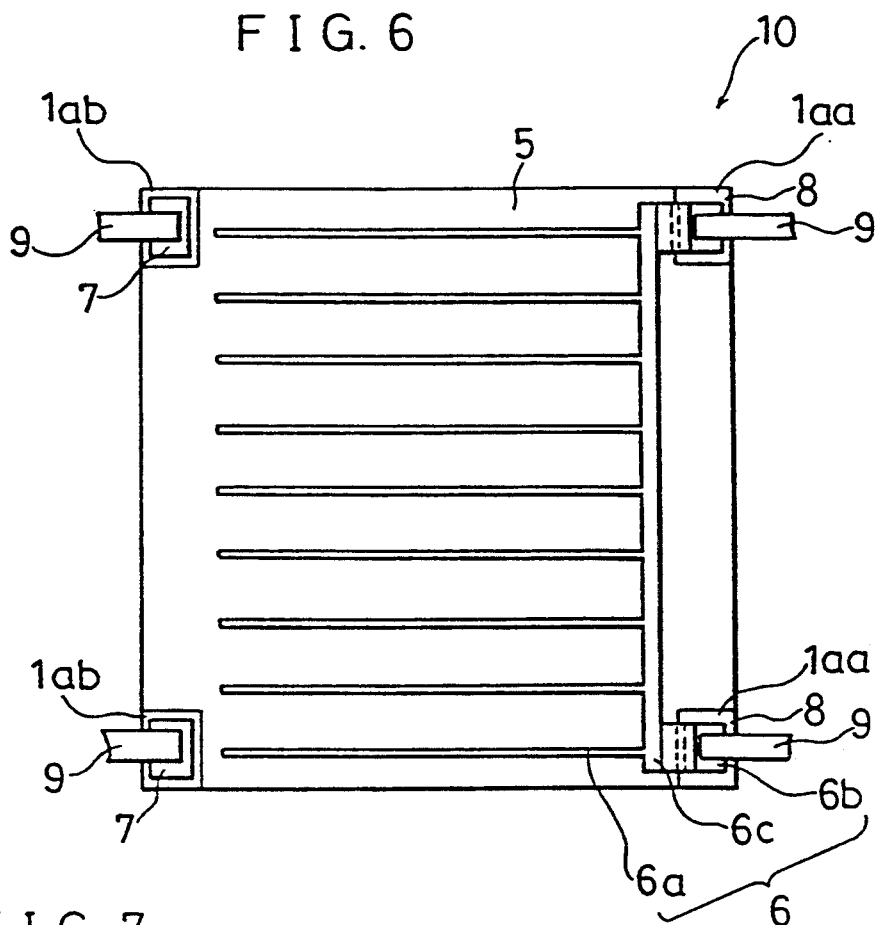
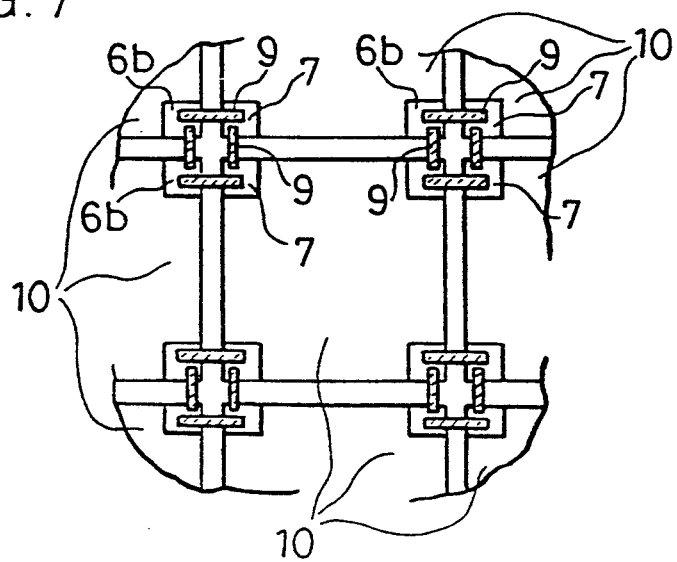

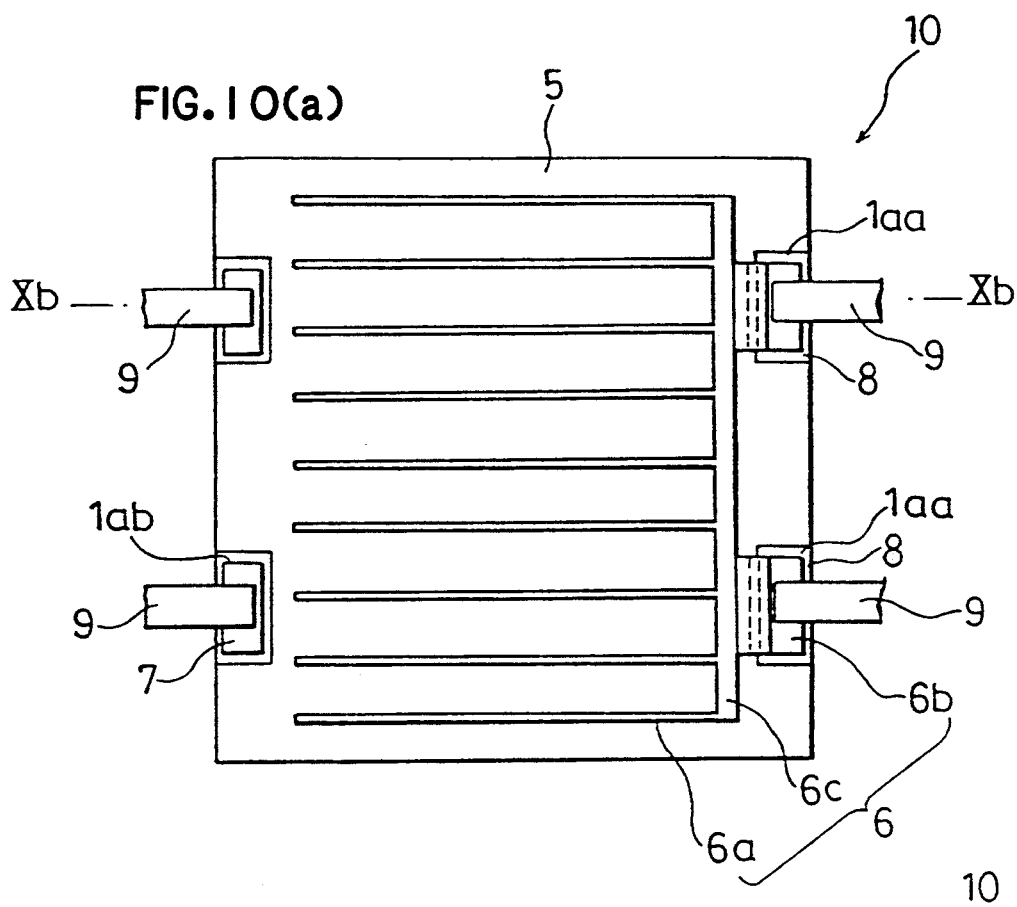
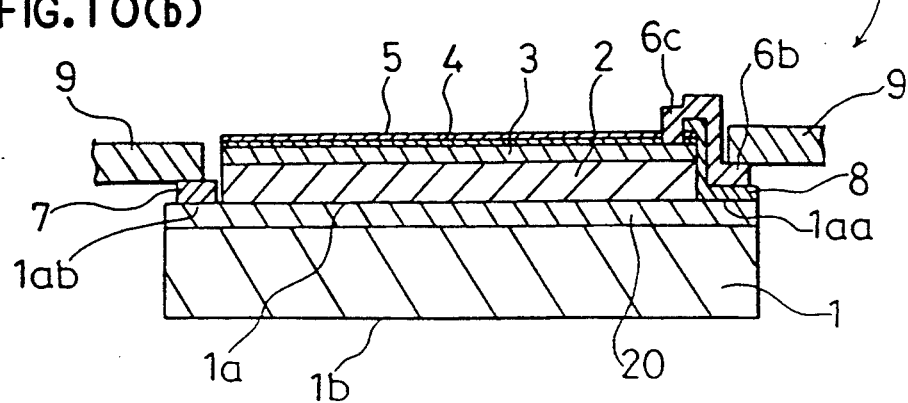

PHOTOVOLTAIC SEMICONDUCTOR DEVICE

FIELD OF THE INVENTION

The present invention relates to a photovoltaic semiconductor device and, more particularly, to a solar cell comprising a compound semiconductor solar cell laminated on a silicon (Si) substrate.

BACKGROUND OF THE INVENTION

FIGS. 15(a)-15(c) show a prior art solar cell 51 with gallium arsenide (GaAs) laminated on a Si substrate as an example of the photovoltaic semiconductor device disclosed in Japanese Patent Publication 64-61958. FIG. 15(a) is a plan view showing a solar cell 51 with GaAs laminated on a Si substrate and FIGS. 15(b) and 15(c) are cross-sectional views along lines XVb—XVb and XVc—XVc of FIG. 15(a), respectively. An n-type GaAS layer 2, a p-type GaAs layer 3, and an anti-reflection film 5 are sequentially disposed on an n-type Si substrate 1. A bus electrode 6b of p-side electrode 6 is disposed on the Si substrate 1 with an intervening insulating film 8. The insulating film 8 prevents the n-side electrode 12 disposed on the rear surface of the Si substrate 1 from short-circuiting with the p-side electrode 6. A grid electrode 6a of p-side electrode 6 disposed on the p-type GaAs layer 3 is connected with the bus electrode 6b and part of the grid electrode 6a is disposed on the Si substrate 1, as shown in FIG. 15(c). The pn junction 13 of the GaAs solar cell layer and the grid electrode 6a are electrically separated by the insulating film 8.

In the solar cell 51 with GaAs layers 2 and 3 laminated on the Si substrate 1, the bus electrode 6b is disposed on the Si substrate 1 with the intervening insulating film 8. Therefore, stress arising during the welding of the external connector 9 is not directly applied to the GaAs layers and there is no cracking in the GaAs layers.

In the prior art solar cell 51 with GaAs laminated on an Si substrate 1, no problems occur when the external connector 9 is welded onto the p-side electrode 6. However, when a connector is welded onto the n-side electrode 12 disposed on the rear surface of the Si substrate 1, cracks occur in the Si substrate 1 and the GaAs solar cell layers 2 and 3, collectively referred to as layer 24 and so designated in FIGS. 16 and 17.

Usually, GaAs layers 2 and 3 are epitaxially grown on the Si substrate 1 at a high temperature, about 700° C., and then the substrate is gradually cooled. In this process, the stress due to the difference in the lattice constants of Si and GaAs at the interface of the Si substrate 1 and the GaAs solar cell layers 2 and 3 is relieved because the degree of freedom of the atoms is high at about 700° C. However, when the substrate is cooled to about 350° C., the degree of freedom of the atoms is reduced and the stress cannot be relieved. Accordingly, due to the different thermal expansion coefficients of Si ($2.4 \times 10^{-6} K^{-1}$) and GaAs ($5.7 \times 10^{-6} K^{-1}$), the solar cell layer 24 becomes convex and stress accumulates inside the GaAs layer. This stress is sufficient to crack the GaAs layers 2 and 3. Although it may be possible to resist this stress in a static state, when a dynamic stress, such as a mechanical or a thermal stress, is applied, it is quite likely that cracking will occur in the GaAs solar cell layers 2 and 3 on the Si substrate 1.

A plurality of solar cells are usually connected by external connectors in a practical use. FIG. 17 shows a plurality of solar cells 51 connected by external connectors 9. The prior art solar cell 51 has an n-side electrode 12 on the rear surface of the Si substrate 1. Therefore, when the external connector 9 is connected to the n-side electrode 12, the solar cell 51, which is convex, is placed on a base 14 and heated while pressure is locally applied to the solar cell 51 by the welding head 15, as shown in FIG. 16. A bending moment is applied to the whole of the solar cell 51 and a local thermal stress is further applied from the welding head 15. Therefore, cracking occurs in the GaAs layer 24, i.e., layers 2 and 3, where the welding head 15 contacts the solar cell and the GaAs solar cell layer 24 may be broken. Thereby, the photovoltaic characteristics of the solar cell layer 51 are adversely affected. In some cases, the Si substrate 1 peels off and the solar cell cannot be used.

SUMMARY OF THE INVENTION

It is an object of the present invention to provide a photovoltaic semiconductor device comprising a GaAs solar cell laminated on a Si substrate that is free of cracking in the GaAs solar cell layers and breakage of the Si substrate when an external connector is welded to the electrodes of the semiconductor device.

Other objects and advantages of the present invention will become apparent from the detailed description given hereinafter. The detailed description and specific embodiments are provided for illustration only, since various additions and modifications within the spirit and scope of the invention will become apparent to those of skill in the art from the detailed description.

A photovoltaic semiconductor device according to the present invention includes a first conductivity type Si substrate having a first main surface, a first conductivity type compound semiconductor layer disposed on a first part of the first main surface of the Si substrate, a second conductivity type compound semiconductor layer disposed on the first conductivity type compound semiconductor layer, a first electrode connected with the second conductivity type compound semiconductor layer, an insulating film disposed on a second portion of the first main surface of the Si substrate and between part of the first electrode and the first main surface of the Si substrate, and a second electrode disposed on a third portion of the first main surface of the Si substrate.

In the present invention, because not only the first electrode but also the second electrode are disposed on respective portions of the first main surface of the first conductivity type Si substrate, no mechanical stress or thermal stress is applied to the compound semiconductor layer during welding of an external connector to the second electrode and no cracking occurs in the semiconductor layer. In addition, because the second electrode is disposed on part of the first main surface of the Si substrate where the compound semiconductor layer is absent, no stress is present in the Si substrate because of the thermal expansion coefficient difference from the compound semiconductor layer and, therefore, the Si substrate is not broken by mechanical and thermal stresses.

BRIEF DESCRIPTION OF THE DRAWINGS

FIGS. 1(a), 1(b), and 1(c) are a plan view and two cross-sectional views showing a GaAs solar cell laminated on a Si substrate according to a first embodiment of the present invention;

FIGS. 3(a), 3(b), and 3(c) are a plan view and two cross-sectional views showing a GaAs solar cell laminated on a Si substrate according to a second embodiment of the present invention;

FIG. 6 is a plan view showing a GaAs solar cell laminated on a Si substrate according to a third embodiment of the present invention;

FIGS. 7 and 8 are plan views showing a plurality of the solar cell devices of FIG. 6 connected with each other by external connectors;

FIGS. 10(a) and 10(b) are a plan view and a cross-sectional view showing a GaAs solar cell laminated on a Si substrate according to a fifth embodiment of the present invention;

DETAILED DESCRIPTION OF THE PREFERRED EMBODIMENTS

Figure 2:
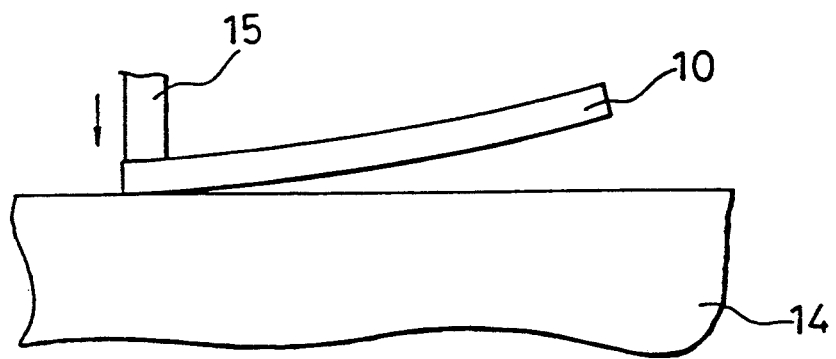
FIG. 2 is a cross-sectional view showing an assembly for welding external connectors to the n-side electrode of a GaAs solar cell laminated on a Si substrate according to the present invention.

FIGS. 1(a), 1(b), and 1(c) show a solar cell 10 including a GaAs layer laminated on a Si substrate as a first embodiment of the present invention. FIG. 1(a) is a plan view thereof, FIG. 1(b) is a cross-sectional view along line Ib—Ib of FIG. 1(a), and FIG. 1(c) is a cross-sectional view along line Ic—Ic of FIG. 1(a).

An n-type GaAs layer 2 is disposed on a first part of the n-type Si substrate 1, a p-type GaAs layer 3 is disposed on layer 2, a p-type AlGaAs layer 4 is disposed on layer 3, and an anti-reflection film 5 is disposed on layer 4. A p-side electrode 6 on the p-type GaAs layer 3 is disposed partly on an insulating film 8 that is disposed on a second part of the first main surface 1a of the Si substrate 1 similar to the prior art device. In this embodiment, the n-side electrode 7 is disposed on a third part 1a main surface 1a of the Si substrate 1 where the GaAs layer is absent and an external connector 9 is connected to the n-side electrode 7.

An n-type GaAs layer 2, a p-type GaAs layer 3, and a p-type AlGaAs layer 4 are successively deposited on the n-type Si substrate 1 to a thickness of 4.5 microns, 0.5 micron, and 300 Angstroms, respectively, by MOCVD, and an electrically conducting anti-reflection film 5 comprising, for example, $Ta_2O_5$, is deposited thereon to a thickness of about 700 Angstroms by evaporation using resistance heating, sputtering, electron beam evaporation, or the like. Thereafter, electrode production portions 1aa and 1ab for the p-side electrode and the n-side electrode, respectively, are produced by etching and an insulating film 8 is deposited on the p-side electrode production portion 1aa. A contact hole reaching the p-type GaAs layer 3 is produced by etching layers 4 and 5 where the p-side electrode is to be produced. Next, a bus electrode 6c of the p-side electrode 6 which is electrically connected to the p-type GaAs layer 3 through the contact hole in the anti-reflection films 5 and a p-type AlGaAs layer 4 is deposited. A portion 6b of the p-side electrode 6 is disposed on the electrically insulating film 8 opposite part 1aa of the first main surface of the Si substrate 1. A grid electrode 6a of the p-side electrode 6 is disposed on the p-type GaAs layer 3 and is in contact with the bus electrode 6c. An n-side electrode 7 is deposited on the part 1ab of the first main surface of the Si substrate 1. By using Ti/Au or Ti/Ag materials for both electrodes, a good ohmic contact is obtained at both the p and n sides. Further, it is possible to simplify the processes for producing the electrodes by vapor deposition or plating both electrodes at the same time. Thereafter, external connectors 9 are connected by welding at predetermined portions of the electrodes 7 and 6, thereby completing a solar cell 10.

The GaAs solar cell 10 of this embodiment has the n-side electrode 7 disposed on a part of the first main surface 1a of the Si substrate 1. Thereafter, when external connectors 9 are connected to the n-side electrode, no thermal nor mechanical stress occurs during welding even when there is local heating from the welding head 15 which could affect the GaAs layers and, therefore, no cracking occurs in the GaAs layers. Furthermore, the n-side electrode 7 is disposed on part of the first main surface 1a of the Si substrate 1 and the solar cell 10 is concave. Therefore, as illustrated in FIG. 2, when the n-side electrode 7 is pressed against base 14 by the welding head 15 for connection of an external connector, the other end of the solar cell 10 (the side of the p-side electrode 6) rises and unfavorable mechanical stresses on the GaAs layer are avoided. Further, breakage of the Si substrate due to stress is prevented. Therefore, external connectors are easily connected to the solar cell without adversely affecting the photovoltaic characteristics of or structurally destroying the solar cell 10. Thus, a practical GaAs solar cell laminated on an Si substrate is produced.

The solar cell of this embodiment has a structure in which both the p-side and n-side electrodes 6 and 7 are disposed on parts of the first main surface of the Si substrate 1. When a plurality of solar cells 10 are connected in series with external connectors, the external connectors 9 are only disposed at one side of the first main surface of the Si substrate 1. This structure makes it possible to connect respective solar cells close to each other.

Figure 4:
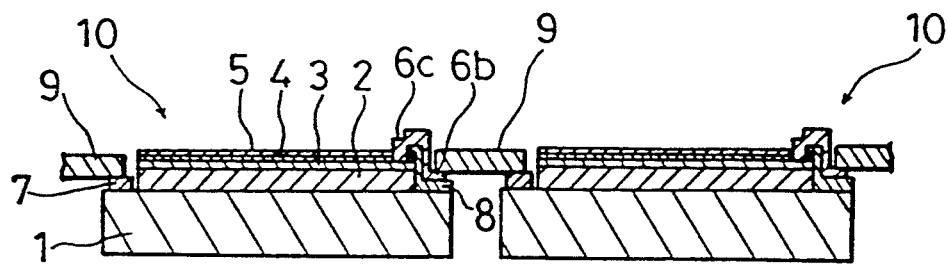
FIG. 4 is a cross-sectional view showing a plurality of solar cell devices of the present invention connected by external connectors.
Figure 17:
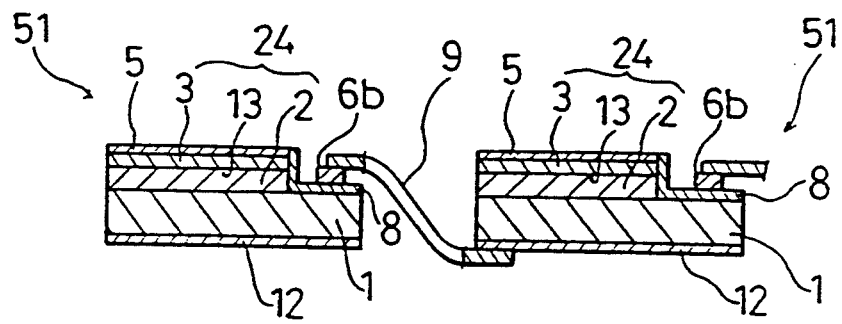
FIG. 17 is a cross-sectional view showing a plurality of the solar cell devices of FIG. 15 connected to each other by external connectors.

In order to serially connect a plurality of conventional structure solar cells, each external connector connected to the first main surface is also required to be connected to the second main surface of an adjacent solar cell, as shown in FIG. 17. When the spacing between the solar cells is small, the external connectors 9 may be broken and contact the n-type part of the side face of the solar cell, resulting in electrical short-circuiting, or the external connector may contact the exposed pn junction of the cell, resulting in electrical short-circuiting. Therefore, the spacing between adjacent solar cells is generally required to be at least about 1 mm. This spacing unfavorably reduces the effective light-receiving area when the solar cells are assembled in a panel. For example, in solar cells having a spacing interval of 20 mm, the loss of area amounts to 5%. This loss is approximately equal to the ratio of the electrode area to the solar cell area, resulting in a large loss in the output of the panel. In this embodiment, however, since the p-side electrode 6 and the n-side electrode 7 are disposed in the same plane, the spacing interval between the solar cells 10 can be made quite small, thereby enabling successive connections of the external connectors 9, as shown in FIG. 4. More concretely, it is possible to make the spacing between the solar cells 10 0.1 mm. Then, the loss of the effective area can be 0.5%, a negligible value.

Figure 5A:
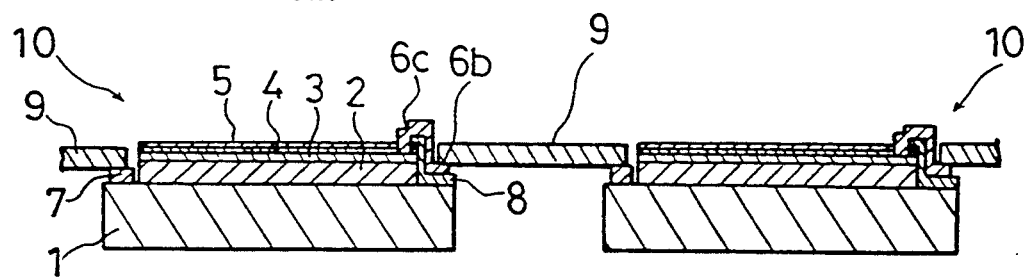
FIGS. 5(a) and 5(b) are cross-sectional views showing processes in which a plurality of solar cell devices of the present invention are connected to each other by external connectors.
Figure 5B:
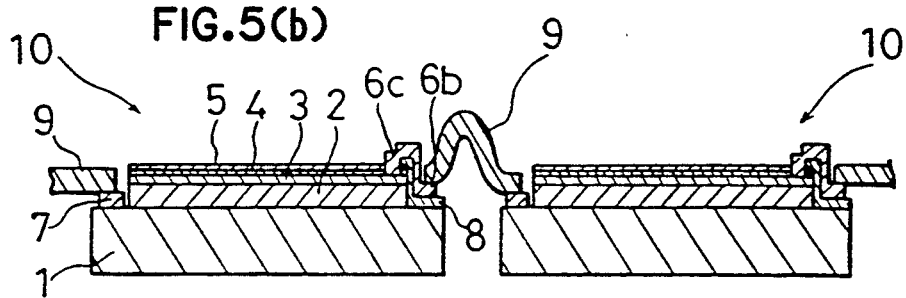

In order to achieve high assembly reliability, the n-side electrode 7 and the p-side electrode 6 of adjacent cells are connected by external connectors 9, as shown in FIG. 5(a). Thereafter, the external connectors 9 are curved upward in a loop configuration when the interconnected cells are formed into a panel, thereby reducing the spacing between the solar cells. In such a production method, thermal stress arising due to the thermal expansion and vibrations is absorbed at the curved part of the loop configuration and there is no danger of separation of the welded junctions. Thus, highly reliable assembly is achieved.

Figures 3A, 3B:
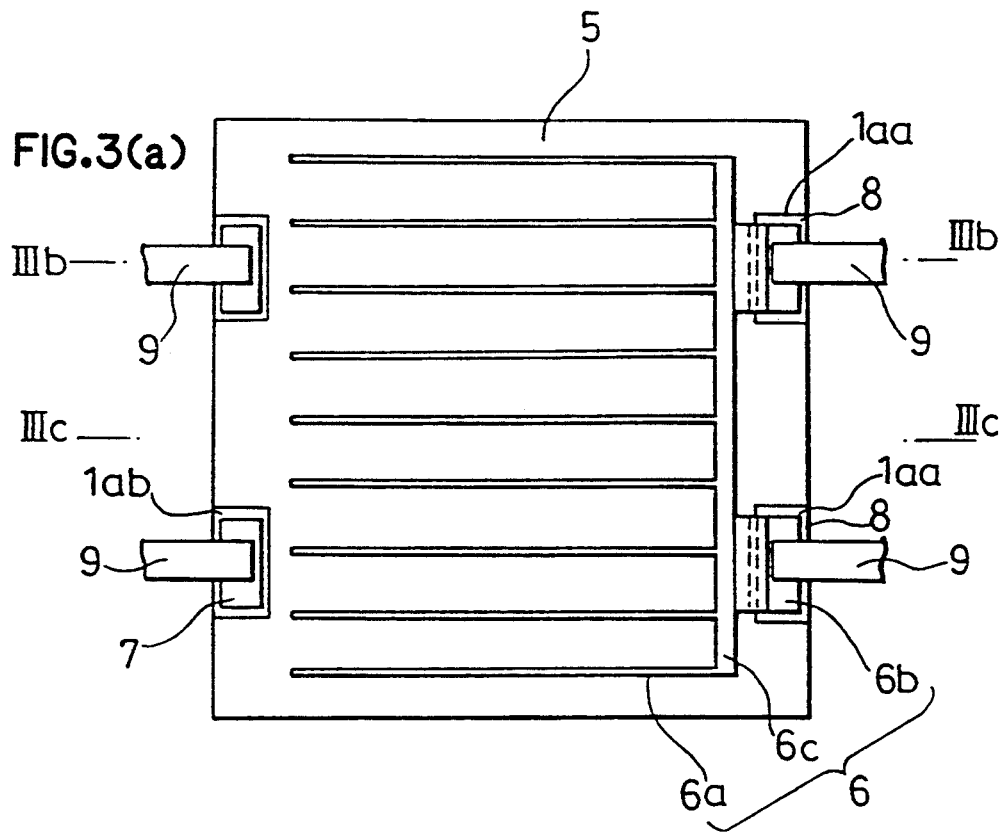

FIGS. 3(a) to 3(c) show a photovoltaic semiconductor device in accordance with a second embodiment of the present invention. FIG. 3(a) shows a plan view, FIG. 3(b) shows a cross-sectional view along line IIIb—IIIb of FIG. 3(a), and FIG. 3(c) shows a cross-section view long line IIIc—IIIc of FIG. 3(a). The device of FIG. 3(a) includes an n-type GaAs layer 2 disposed on part of the n-type Si substrate 1, a p-type GaAs layer 3 disposed on the n-type GaAs layer 2, a p-type AlGaAs layer 4 disposed on layer 3, and a reflection preventing film 5 disposed on layer 4. A grid electrode 6a of the p-side electrode 6 is disposed on and electrically connected to the p-type GaAs layer 3, and a bus electrode 6c of the p-side electrode 6. The p-side electrode 6 is electrically connected to the p-type GaAs layer 3 through a contact hole and a portion 6b thereof is disposed on the insulating film 8 opposite a part 1aa of the first main surface 1a of the Si substrate 1. The grid electrode 6a is connected with the bus electrode 6c. An n-side electrode 7 is disposed on a part 1ab of the first main surface 1a of the Si substrate, 1 similar to the first embodiment. In this embodiment, the GaAs solar cell layer is removed only where the external connector 9 is to be welded and where a bus electrode 6b of the p-side electrode 6 and an n-side electrode 7 to which external connectors 9 are respectively connected are disposed, i.e., at opposed positions along the periphery of the first main surface 1a of the Si substrate 1. This arrangement means that the smallest amount of the GaAs layer is removed and the amount of the loss of the region for generating electricity is reduced relative to the first embodiment, resulting in high efficiency photovoltaic conversion. Further, the p-side electrode 6b and the n-side electrode 7 to which external connectors 9 are connected are provided at mutually opposed peripheral positions and it is possible to connect the external connectors 9 to other solar cells by positioning the solar cells close to each other, thereby further increasing the effective light-receiving surface area.

FIG. 6 shows a photovoltaic semiconductor device in accordance with a third embodiment of the present invention. Four locations at which the external connectors 9 are welded are respectively provided at the four corners of the solar cell. This device has the advantage that parallel connection of the solar cells is simplified in addition to the same advantage as the second embodiment for connecting the solar cells with external connectors 9. In more detail, as shown in FIG. 7, gold external connectors 9 for serial connection and gold external connectors 9 for parallel connection can be welded to the same electrode of a solar cell and these connectors can be further welded to the electrodes of the adjacent solar cells. Furthermore, because the locations at which the external connectors 9 are welded are located on corners, the light-receiving area is not covered by the external connectors 9 and there is no reduction in the electrical output of the solar cell.

Figure 8:
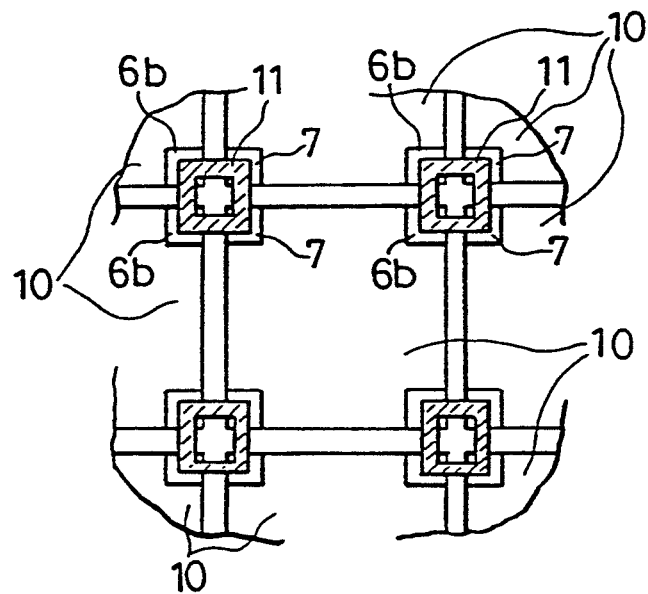

In addition, the portions of four adjacent solar cells to which external connectors are to be connected can be connected together by using a ring-shaped external connector 11, as shown in FIG. 8. Then, the number of welding cycles during assembly is reduced and the welding process is simplified.

Figure 9:
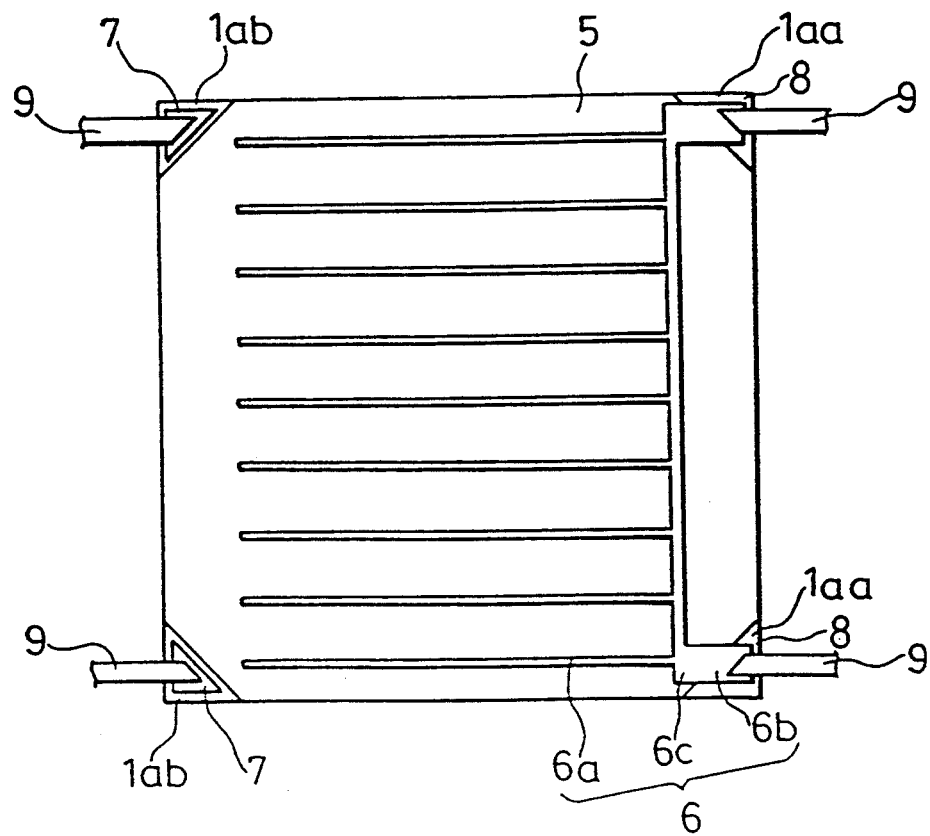
FIG. 9 is a plan view showing a GaAs solar cell laminated on a Si substrate according to a fourth embodiment of the present invention.

FIG. 9 shows a fourth embodiment of the present invention. This fourth embodiment is different from the embodiment of FIG. 3 only in that the portion to which the external connector 9 is to be connected has a triangular configuration. This fourth embodiment also has the same advantage in welding of the external connector 9 as the third embodiment. This fourth embodiment has a further advantage in that a cover glass can be attached to the respective solar cells before welding the external connectors.

In order to protect the solar cell from variations in external environment, such as temperature or moisture, a cover glass is mounted on the light-receiving surface of the solar cell with a plastic adhesive layer. Since the cover glass is generally rectangular, because of limitations on the precision of cutting the cover glass, it is difficult to locate the cover glass only at the effective light-receiving region. Therefore, the cover glass is generally provided over the entire surface of the solar cell 10 including the effective light-receiving area and the external connector welding portion. In this case, however, since the thickness of the external connector 9 is usually about 30 microns and has also a larger thermal expansion coefficient, if the cover glass is not thicker than a certain value, considering these factors, the cover glass will separate from the solar cell because of changes in the environment. Therefore, the plastic adhesive layer cannot be thinner than a certain value so that reducing the weight of the element has been difficult.

In this embodiment, however, by further cutting off the corners of the rectangular cover glass, it is easily possible to make the configuration of the cover glass coincide with the configuration of the effective light-receiving area. Accordingly, it is possible to cut off the corners of the cover glass and adhere it to the effective light-receiving area and thereafter to connect the external connector to the exposed electrode portion. Further, because the cover glass is not required at the external connector welding portion, the plastic adhesive layer can be quite thin and a reduction in the weight of the element is achieved.

In the above-described first to fourth embodiments, by using an Si substrate having a low sheet resistance as the Si substrate 1, it is possible to reduce the resistance loss along the distance traveled by electrons collected by the n-side electrode 7.

FIGS. 10(a) and 10(b) show a photovoltaic semiconductor device in accordance with a fifth embodiment of the present invention. FIG. 10(a) is a plan view and FIG. 10(b) is a cross-sectional view taken along line Xb—Xb of FIG. 10(a). In FIG. 10(a), an n-type high dopant impurity concentration layer 20 having an impurity concentration above $2 \times 10^{19}$ cm$^{-3}$ is disposed on part of the first main surface 1a of the Si substrate 1. Layer 20 is formed by ion implantation, diffusion, or epitaxial growth. The GaAs solar cell layer is disposed on the doped layer 20. By providing a layer 20 having a high dopant impurity concentration and low resistivity, the sheet resistance of the Si substrate 1 is lowered. The photovoltaic current is collected at the n-side electrode 7 through the doped layer 20 having low sheet resistance. Therefore, limitations on the resistivity of the Si substrate 1 can be relaxed.

Figure 11A:
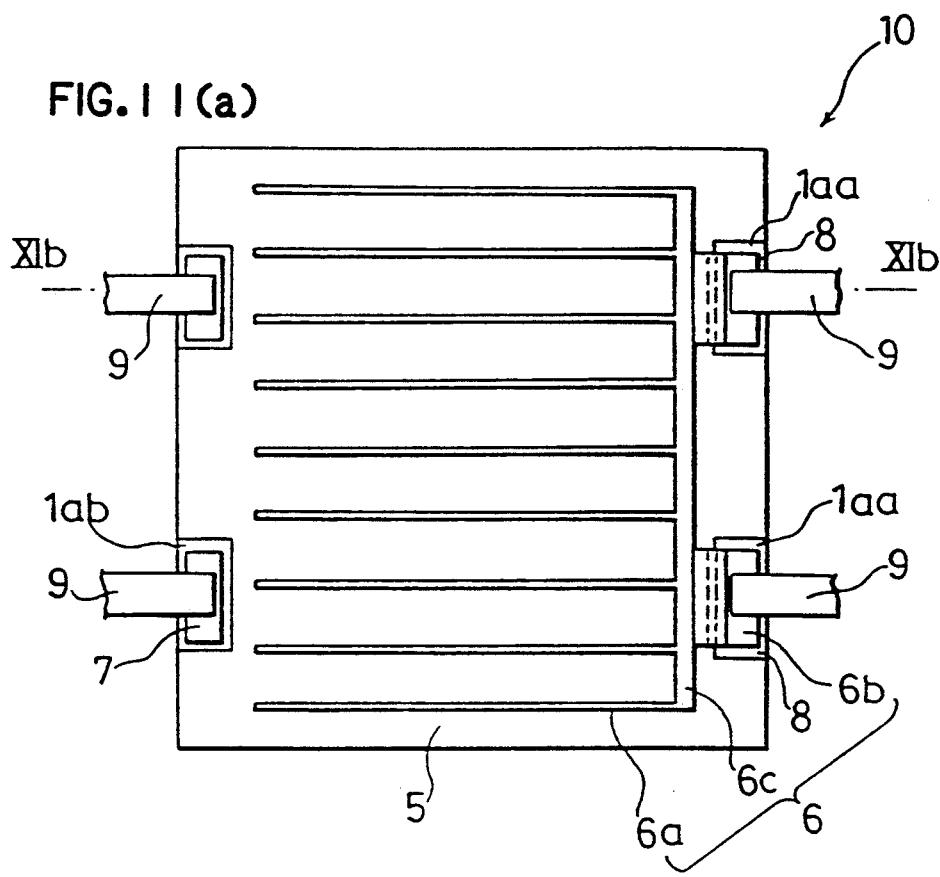
FIGS. 11(a) and 11(b) are a plan view and a cross-sectional view showing a GaAs solar cell laminated on a Si substrate according to a sixth embodiment of the present invention.
Figure 11B:
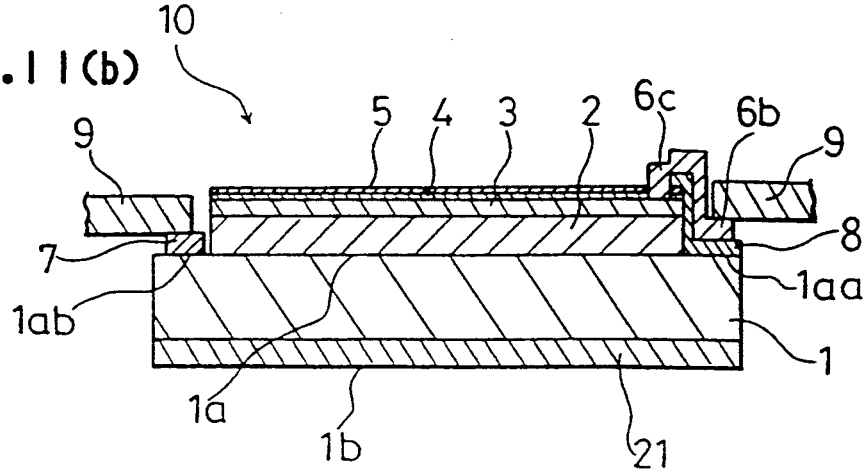

FIGS. 11(a) and 11(b) show a sixth embodiment of the present invention. FIG. 11(a) shows a plan view and FIG. 11(b) shows a cross-sectional view taken along line XIb—XIb of FIG. 11(a). In FIG. 11(a), an n-type high dopant impurity concentration layer 21 is produced on the second main surface 1b of the Si substrate 1 (the layer 21 is hereinafter referred to as the rear surface doped layer). Thus, it is also possible to lower the sheet resistance of the Si substrate 1 by providing the rear surface doped layer 21 having a low resistivity with the same effects as those of the first embodiment.

Figure 12A:
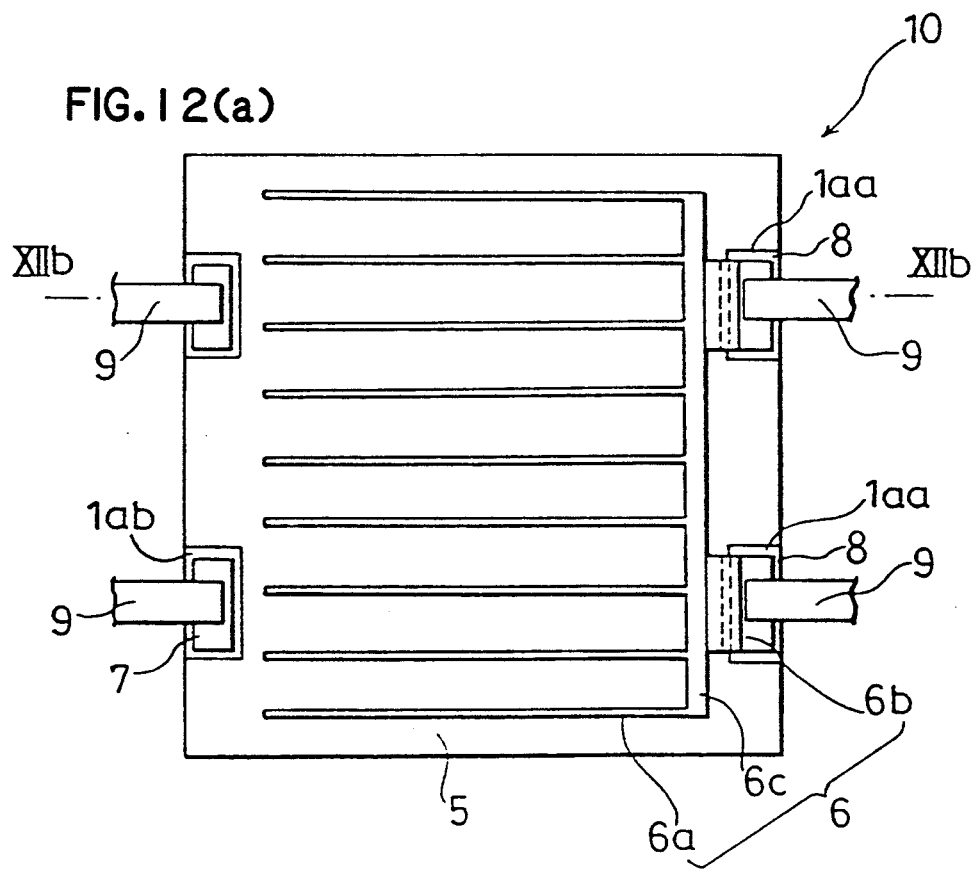
FIGS. 12(a) and 12(b) are a plan view and a cross-sectional view showing a GaAs solar cell laminated on a Si substrate according to a seventh embodiment of the present invention.
Figure 12B:
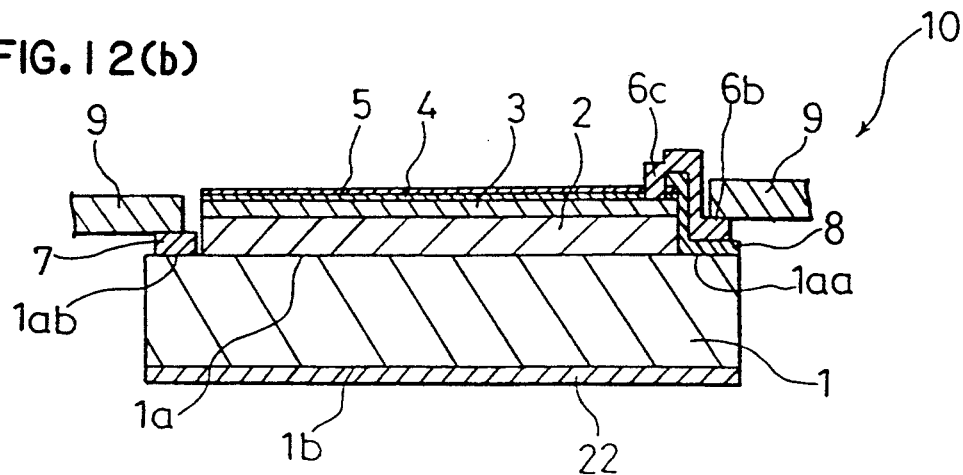

FIGS. 12(a) and 12(b) show a seventh embodiment of the present invention. FIG. 12(a) shows a plan view and FIG. 12(b) shows a cross-sectional view taken along line XIIb—XIIb of FIG. 12(a). In FIG. 12(a), a metal layer 22 having a thickness of 2000 to 3000 Angstroms comprising, for example, Ti/Au or Ti/Ag is produced on the second main surface 1b of the Si substrate 1 by, for example, sputtering or deposition. The photovoltaic current is collected by the n-side electrode 7 through the metal layer 22 having a low sheet resistance. Accordingly, the composition and thickness of the metal layer 22 can make the resistance loss so small that it has no adverse influence on the photovoltaic properties of the solar cell 10.

Figure 13A:
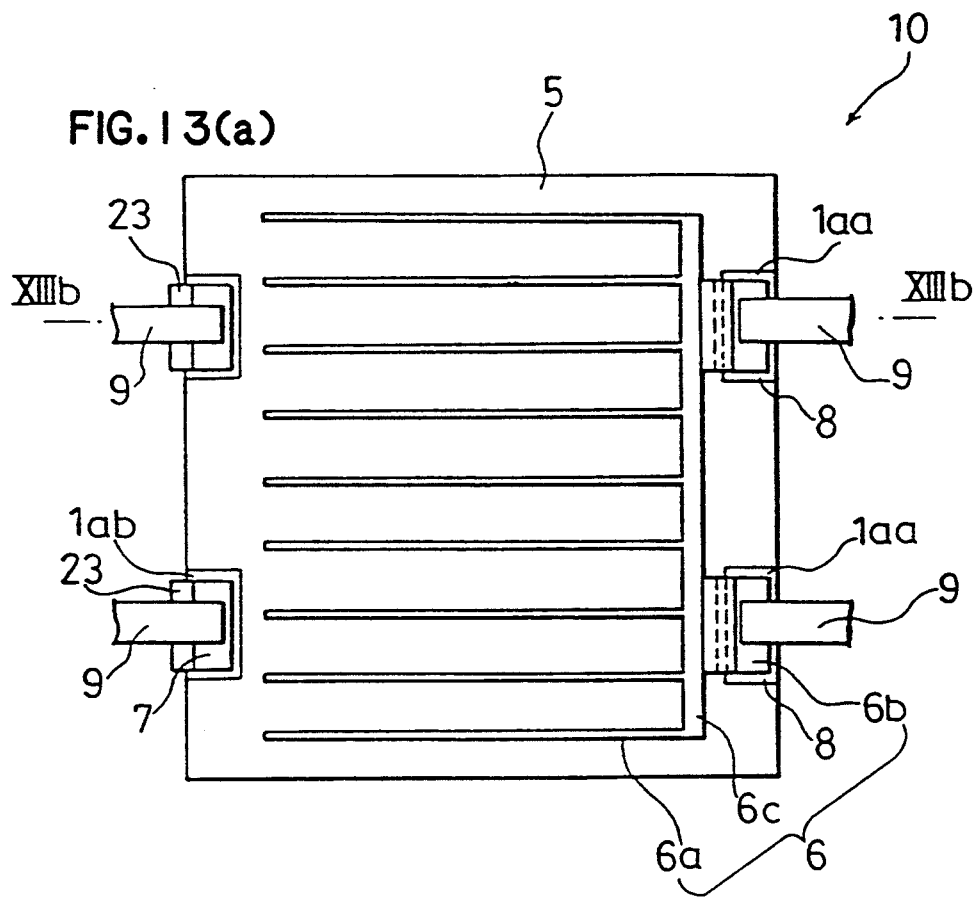
FIGS. 13(a) and 13(b) are a plan view and a cross-sectional view showing a GaAs solar cell laminated on a Si substrate according to an eighth embodiment of the present invention.
Figure 13B:
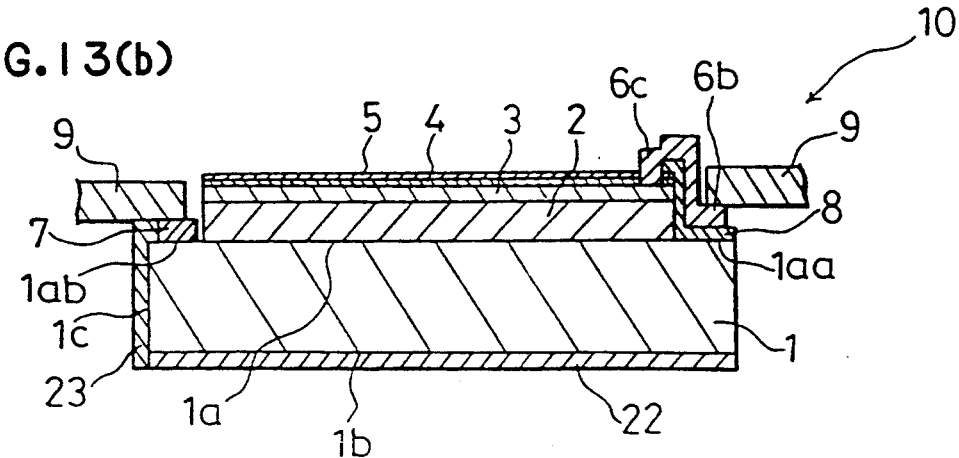

FIGS. 13(a) and 13(b) show an eighth embodiment of the present invention. FIG. 13(a) shows a plan view and FIG. 13(b) shows a cross-sectional view taken along line XIIIb—XIIIb of FIG. 13(a). In the figure, side face wiring layer 23 is produced on the side face 1c of the Si substrate 1 by sputtering or the like. The n-side electrode 7 is electrically connected to the metal layer 22 via the side face wiring layer 23. Thereby, the resistance loss occurring between the metal layer 22 and the n-side electrode 7 can be further reduced relative to the seventh embodiment.

Figure 14A:
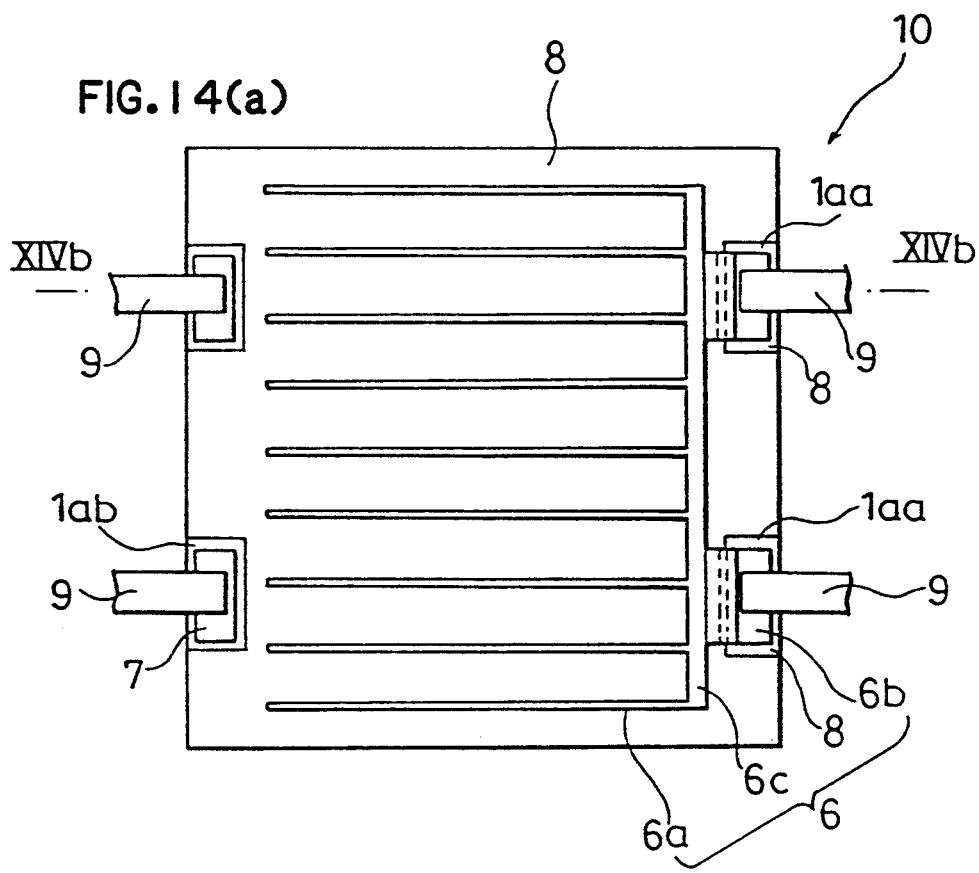
FIGS. 14(a) and 14(b) are a plan view and a cross-sectional view showing a GaAs solar cell laminated on a Si substrate according to a ninth embodiment of the present invention.
Figure 14B:
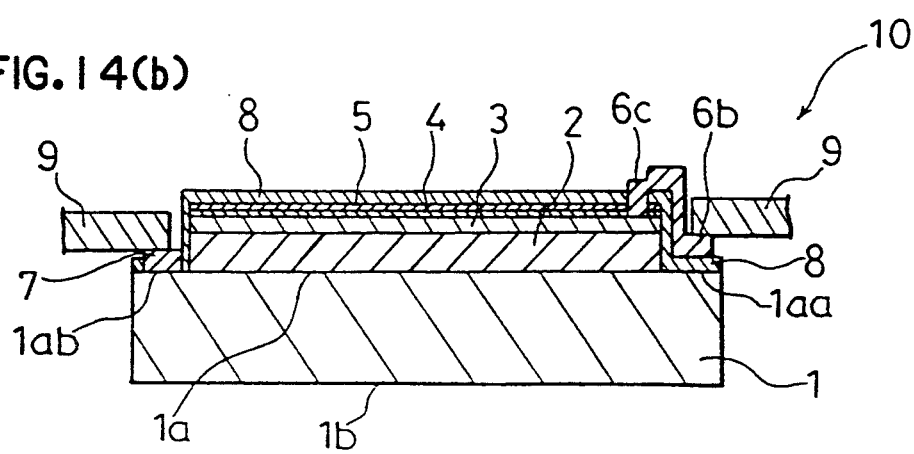
Figure 15A:
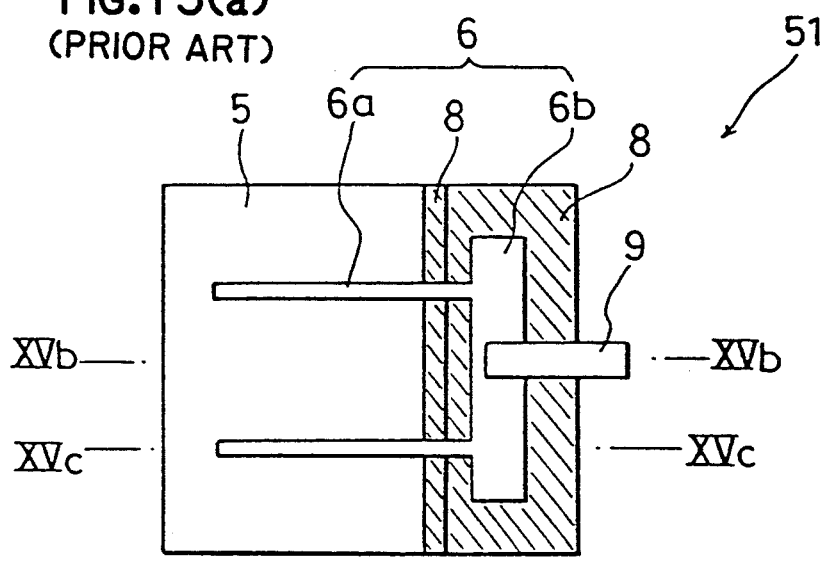
FIGS. 15(a) to 15(c) are a plan view and two cross-sectional views showing an example of a GaAs solar cell laminated on a Si substrate according to the prior art.
Figure 15B:
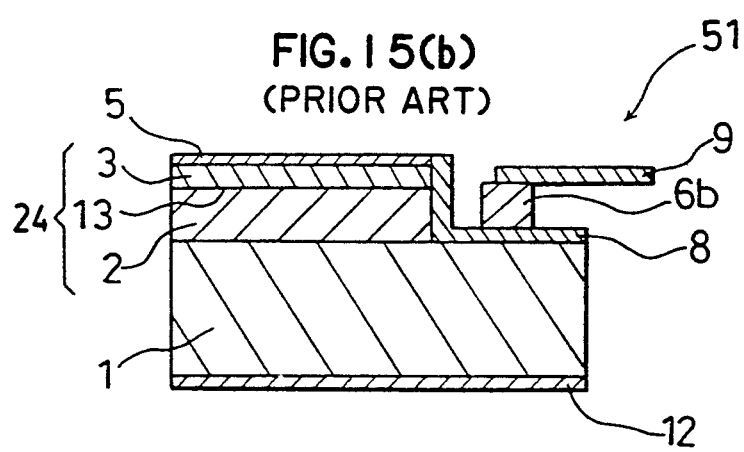
Figure 15C:
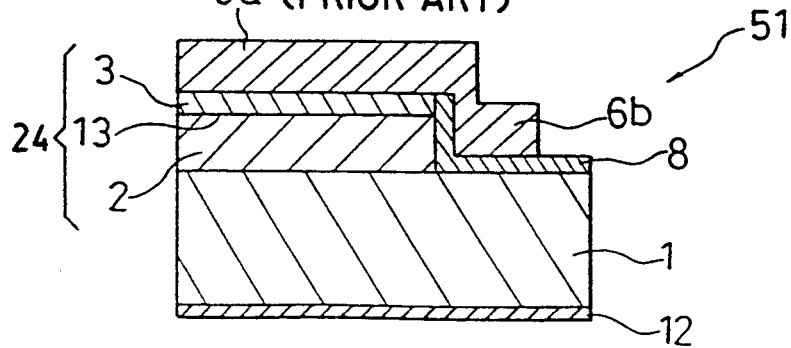
Figure 16:
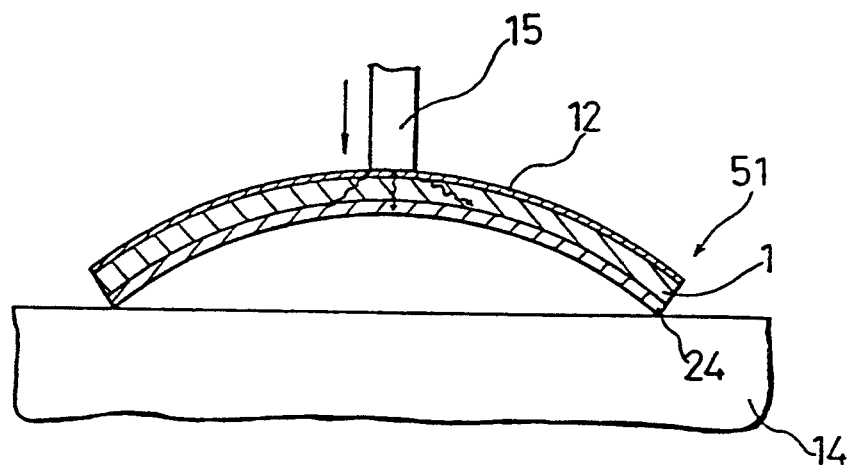
FIG. 16 is a cross-sectional view showing an assembly of the conventional solar cell device of FIG. 15.

FIGS. 14(a) and 14(b) show a ninth embodiment of the present invention. FIG. 14(a) shows a plan view thereof and FIG. 14(b) shows a cross-sectional view taken along line XIVb—XIVb of FIG. 14(a). In this embodiment, the insulating film 8 is disposed on the anti-reflection film 5 and the side wall portion of the GaAs solar cell. The p-side electrode 6 is electrically connected to the p-type GaAs layer 3 through a contact hole in the insulating film 8, the reflection-preventing film 5, and the p-type AlGaAs layer 4. In this embodiment, the insulating film 8 is not required to be selectively produced and selectively removed, so that the manufacturing process is simple.

In the above-described eighth embodiment, the refractive index of the insulating film 8 is approximately 1.4 to 1.6 and it is possible to choose the insulating film 8 considering the refractive index of a cover glass adhered to the element. Thereby, it is possible to reduce the reflection losses due to a difference between the refractive indices of the insulating film 8 and the cover glass. For example, when the insulating film 8 is SiO$_x$, the refractive index can be 1.5, which is approximately equal to the refractive index of the cover glass, by establishing the value of x as 1.5.

In the above-described embodiment, GaAs is used as the compound semiconductor, but the present invention is not limited thereto. Any compound semiconductor, such as InP, having a thermal expansion coefficient larger than the thermal expansion coefficient of the Si substrate can be used.

As is evident from the foregoing description, according to the present invention, the p-side electrode and the n-side electrode are disposed on parts of the first main surface of the Si substrate. Therefore, cracking of the GaAs solar cell layers and breakage of the solar cell device during welding of external connectors to the n-side electrode of the solar cell are prevented. Thus, a GaAs solar cell laminated on an Si substrate can be effectively utilized. In addition, while wiring a plurality of solar cells together with external connectors, the spacing interval between the adjacent solar cells can be narrowed, increasing the effective light-receiving area of a panel of the solar cells.

What is claimed is:

1. A photovoltaic semiconductor device comprising:
   a first conductivity type silicon substrate having a first main surface including a periphery and a second main surface opposite the first main surface;
   a first conductivity type compound semiconductor layer disposed on a first, major portion of the first main surface of said silicon substrate;
   a second conductivity type compound semiconductor layer disposed on said first conductivity type compound semiconductor layer and forming a photovoltaic junction therewith;
   a first electrode connected to said second conductivity type compound semiconductor layer;
   an insulating film disposed on a second, minor portion of the first main surface of said silicon substrate, said first electrode being disposed on said insulating film; and
   a second electrode disposed on a third, minor portion of the first main surface of said silicon substrate, whereby the second main surface is free of the first and second electrodes.

2. The photovoltaic semiconductor device as defined in claim 1 wherein said compound semiconductor has a larger thermal expansion coefficient than said silicon substrate.

3. The photovoltaic semiconductor device as defined in claim 1 wherein said compound semiconductor is a group III-V compound semiconductor.

4. The photovoltaic semiconductor device as defined in claim 1 wherein said compound semiconductor is GaAs.

5. The photovoltaic semiconductor device as defined in claim 1 wherein said compound semiconductor is InP.

6. The photovoltaic semiconductor device as defined in claim 1 including a first external connector connected to a portion of said first electrode and a second external connector connected to said second electrode.

7. The photovoltaic semiconductor device as defined in claim 6 wherein the first, major portion of the first main surface is distinct from the second and third minor portions of the first main surface.

8. The photovoltaic semiconductor device as defined in claim 6 wherein portions of said first electrode and said second electrode to which external connectors are connected are disposed along opposed portions of said periphery of said first main surface of said silicon substrate.

9. The photovoltaic semiconductor device as defined in claim 6 wherein the portions of said first electrode and said second electrode to which external connectors are connected are disposed at symmetrical, opposed positions on said periphery of said first main surface of said silicon substrate.

10. The photovoltaic semiconductor device as defined in claim 8 wherein said first main surface of said silicon substrate is approximately rectangular and includes four corners, and the portions of said first electrode and said second electrode to which external connectors are connected are disposed at corners of said first main surface of said silicon substrate.

11. The photovoltaic semiconductor device as defined in claim 8 wherein said first main surface of said silicon substrate is approximately rectangular and includes four corners, the portions of said first electrode and said second electrode to which external connectors are connected are disposed at corners of said first main surface of said silicon substrate and said portions are triangular.

12. The photovoltaic semiconductor device as defined in claim 1 wherein said silicon substrate has a relatively low sheet resistance so that the resistance loss along the path of current collected by said second electrode does not substantially affect the photovoltaic characteristics of the device.

13. The photovoltaic semiconductor device as defined in claim 1 wherein said first and second electrodes comprise the same material.

14. The photovoltaic semiconductor device as defined in claim 13 wherein said first and second electrode are produced by the same process.

15. The photovoltaic semiconductor device as defined in claim 1 including an anti-reflection film disposed on said second conductivity type compound semiconductor layer.

16. The photovoltaic semiconductor device as defined in claim 15 including a cover glass disposed on said anti-reflection film.

17. The photovoltaic semiconductor device as defined in claim 14 wherein said insulating film electrically separating said first electrode from said silicon substrate is disposed on said anti-reflection film.

18. The photovoltaic semiconductor device as defined in claim 17 including a cover glass disposed on said insulating film wherein said insulating film has a refractive index approximately equal to that of said cover glass.

19. The photovoltaic semiconductor device as defined in claim 18 wherein the refractive index of said insulating film is 1.4 to 1.6.

* * * * *